(12) United States Patent
Loewe et al.

(10) Patent No.: US 6,879,919 B2
(45) Date of Patent: Apr. 12, 2005

(54) DSP ASSISTED PEAK CAPTURE CIRCUIT AND METHOD

(75) Inventors: Thomas D. Loewe, Wonder Lake, IL (US); Yosuf M. Taraki, Evanston, IL (US); James A. Panko, Wonder Lake, IL (US); Timothy G. Ruther, Cary, IL (US)

(73) Assignee: Snap-On Incorporated, Pleasant Prairie, WI (US)

( * ) Notice: Subject to any disclaimer, the term of this patent is extended or adjusted under 35 U.S.C. 154(b) by 16 days.

(21) Appl. No.: 10/355,267

(22) Filed: Jan. 31, 2003

(65) Prior Publication Data

US 2003/0163265 A1 Aug. 28, 2003

Related U.S. Application Data

(60) Provisional application No. 60/352,585, filed on Jan. 31, 2002.

(51) Int. Cl.[7] .................................................. G06F 1/03
(52) U.S. Cl. ............................. 702/66; 702/67; 702/70; 702/71; 702/73
(58) Field of Search ............................. 702/66, 67, 70, 702/71, 73, 117, 182, 77, 188, 190; 340/618; 370/346; 375/226; 324/103; 327/58, 61, 94; 341/125, 132

(56) References Cited

U.S. PATENT DOCUMENTS

| | | | |
|---|---|---|---|
| 3,979,670 A | | 9/1976 | Vahaviolos |
| 6,429,546 B1 | * | 8/2002 | Ropp et al. .................... 307/31 |
| 6,606,346 B2 | * | 8/2003 | Abraham et al. ........... 375/142 |
| 2003/0146871 A1 | * | 8/2003 | Karr et al. ................... 342/457 |

* cited by examiner

Primary Examiner—Marc S. Hoff
Assistant Examiner—Felix Suarez
(74) Attorney, Agent, or Firm—McDermott Will & Emery LLP (57) ABSTRACT

Peak capture circuitry for measuring a peak value of a waveform characterized by a first portion having a first rate of change and a second portion having a relatively faster rate of change. Peak stretching circuitry stretches a portion of the waveform as a function of time. Digital signal processing circuitry samples an output waveform of the peak stretching circuitry for determining the peak value. Thus, despite any steeply sloped portion, samples can be reliably taken throughout the waveform for calculation of peak value.

30 Claims, 6 Drawing Sheets

DSP ASSISTED PEAK CAPTURE CIRCUIT AND METHOD

This application claims priority to U.S. Provisional Application Ser. No. 60/352,585 filed Jan. 31, 2002.

TECHNICAL FIELD

The subject matter described discussed herein relates to peak value capture circuitry, and more particularly, to a digital signal processing assisted peak capture circuit and methodology.

BACKGROUND OF THE ART

Figure 1:
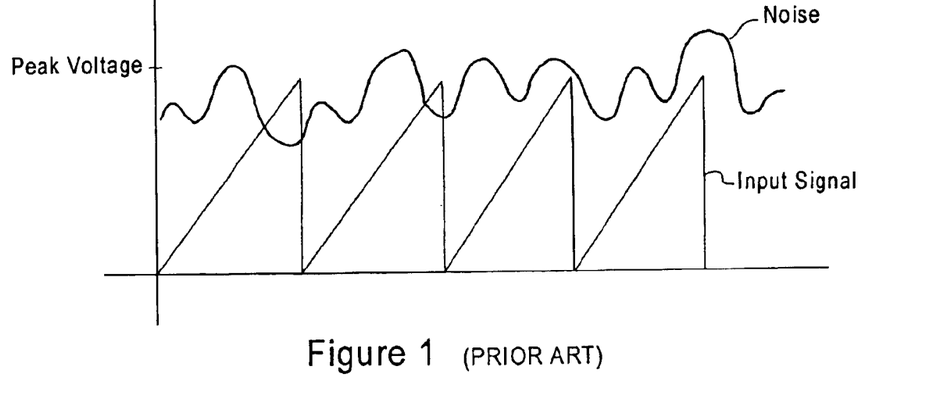
FIG. 1 illustrates noise effects on an input signal applied to conventional peak capture circuitry.

Many diagnostic systems require the capturing and analysis of a peak value of an input waveform. In an analog environment, a conventional Sample and Hold circuit (S/H) is commonly used to determine the peak value. However, S/H circuits typically have associated minimum input voltage requirements. In many diagnostic applications, where the input signal has a peak value below the minimum required input voltage, inaccuracies result due to distortion of the S/H circuit. Specifically, below the minimum input voltage, the input signal tends to become distorted by the noise of the S/H circuit, that might be comparable in magnitude to the peak, as shown by FIG. 1. As a result, the S/H circuit is incapable of reliably detecting peak values. Moreover, for waveforms having a first portion having a first rate of change and a second portion having a relatively faster rate of change, (or vice versa) as shown by FIG. 1, the S/H circuit may be incapable of capturing the peak values due to the second portion whose rate of change cannot be detected by the current.

In an analog environment, one solution to overcome the problem is to amplify the signal at a predetermined gain so that the S/H circuit functions reliably. Alternatively, a phase shift circuit may be implemented to detect the falling edge of the input signal, $V_{IN}$. However, as phase shift circuits are plagued with many of the same problems as S/H circuits, they often tend to fail to function reliably. The remaining corrective measure is amplification of the input signal. In situations where power consumption must be kept to a minimum, such as battery powered diagnostic equipment, amplifying input signals consumes unnecessary amounts of power.

Figure 2:
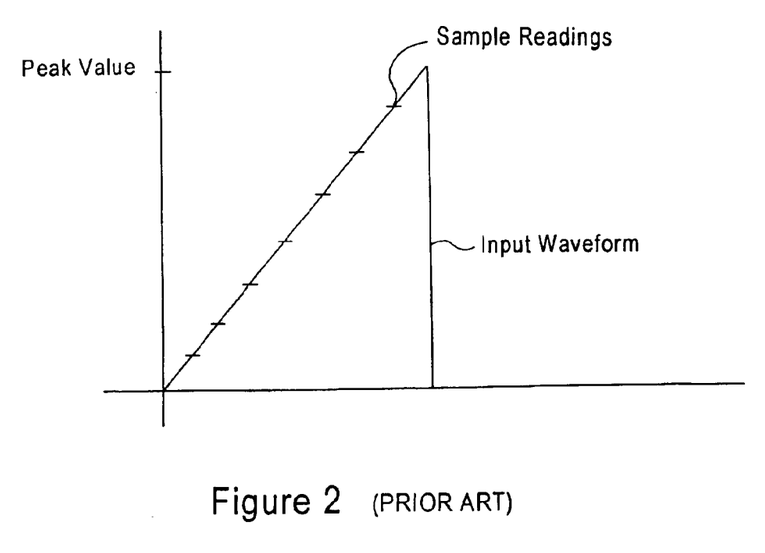
FIG. 2 illustrates an example of a waveform having a gradually sloped portion and to a more steeply sloped portion.

One way to address this problem is by digitally signal sampling the waveform with the use of an analog-to-digital (A/D) converter in order to capture the peak value. As illustrated by FIG. 2, the waveform falls abruptly at a rate faster than the sampling rate. In this regard, a peak value is calculated from the rising edge only. However, as a sample reading does not always capture the peak value, results will tend to be inaccurate. A high sampling rate may be used to overcome this problem, but is undesirable in many diagnostic system applications, as fast A/D converters cost more and require more power to operate. Especially for battery powered diagnostic systems in the field, fast A/D converters are not practical.

Accordingly, a need arises to reliably detect peak voltages of a waveform, especially, an input signal level having high rates of change and/or are low in magnitude.

SUMMARY OF THE INVENTION

These and other needs are met by peak capture circuitry for measuring a peak value of a waveform having a first portion having a first rate of change and a second portion having a relatively faster rate of change, comprising peak stretching circuitry for stretching a portion of the waveform as a function of time, and digital signal processing circuitry for sampling an output waveform of the peak stretching circuitry for determining peak of the waveform. The peak stretching circuitry is configured to stretch the second portion of the waveform at a predetermined expansion rate. In this regard, the peak value may be determined despite the waveform's high rate of change.

The peak stretching circuitry may comprise inverting circuitry for receiving the waveform and for outputting a inverted valued waveform, and R-C circuitry for receiving the inverted valued waveform, and for stretching the second portion of the inverted valued waveform. Advantageously, the decay of the R-C circuitry begins to decay at the peak value, stretching its steep edge.

The inverting circuitry may comprise an operational amplifier having a positive input connecting to ground and having an output connected to a first node, a first resistor connecting to a negative input of the operation amplifier, and a second resistor connecting between the negative input and a second node. With the foregoing configuration, the inverting circuitry outputs an inverted waveform to the input of the R-C circuitry.

The inverting circuitry may further comprise a first diode connected between the negative input and the first node, and a second diode having connected between the first node and the second node. In one configuration, the first and second diodes are forward biased connected relative to the negative input and the first node, respectively. In another configuration, the first and second diodes are connected to be reversed-biased relative to the negative input and the first node, respectively. Advantageously, the inverting circuitry accommodates positive valued waveforms and negative valued waveforms at the input.

The R-C circuitry comprises a resistor and a capacitor connected in parallel between a positive or negative voltage source and an output of the inverting circuitry. The R-C circuitry is set to decay at a predetermined rate during the second portion of the inverted valued waveform having a high rate of change. In this way, an output waveform has a stretched portion, thus lessening the abrupt change and allowing samples to be taken.

The digital signal processing circuitry may be configured to sample a first portion and a second portion of the output waveform of the peak stretching circuitry. The digital signal processing circuitry may be configured further to extrapolate using sample readings measured along the gradually sloped portion and to extrapolate using sample reading measured along the second portion to determine an intersection point for determining a peak value. The digital signal processing circuitry may be configured to linearly extrapolate using sample readings of the first portion and using sampling readings of the stretched portion. The intersection may be adjusted relative to a correction factor for determining the peak value of the input waveform. Advantageously, despite the high rate of change, samples can be reliably taken throughout the waveform for accurate calculation of the peak value.

In even another manner, the concepts discussed herein includes a method for measuring a peak of a waveform having a first portion having a first rate of change and a second portion having a relatively faster rate of change. The method comprises the steps of stretching the steeply sloped portion of the waveform in time, sampling a first portion, sampling the stretched sloped portion, and extrapolating using sampling readings of the first portion and the expanded steeply sloped portion to determine a peak value. The stretching step stretches the second portion at a predetermined decay rate. The stretching step also comprises the steps of outputting the gradually sloped portion of the waveform, and outputting the steeply sloped portion at a predetermined decay rate.

The extrapolating step comprises the steps of determining a first linear representation of the gradually sloped portion using corresponding sampling readings, determining a second linear representation of the expanded steeply sloped portion using corresponding sampling readings, determining the peak value at the intersection of the first linear representation and the second linear representation. The method even further includes applying a correction factor to the peak value determined in the extrapolating step to determine the peak value of the waveform.

In accordance with the foregoing method, an expanded steeply sloped portion of the waveform and a gradually sloped portion of the waveform may be sampled to effectuate calculation of an intersection point, the peak value.

The foregoing and other features, aspects, and advantages of described concepts will become more apparent from the following detailed description when taken in conjunction with the accompanying drawings.

DESCRIPTION OF THE EMBODIMENTS

In the following description, for purpose of explanation, numerous specific details are set forth in order to provide a thorough understanding of the concepts and implementations described. It will be apparent, however, to one skilled in the art that the concepts discussed herein may be practiced without these specific details. In other instances, well-known structures and devices are shown in block diagram form in order to avoid unnecessarily obscuring the description.

Figure 3:
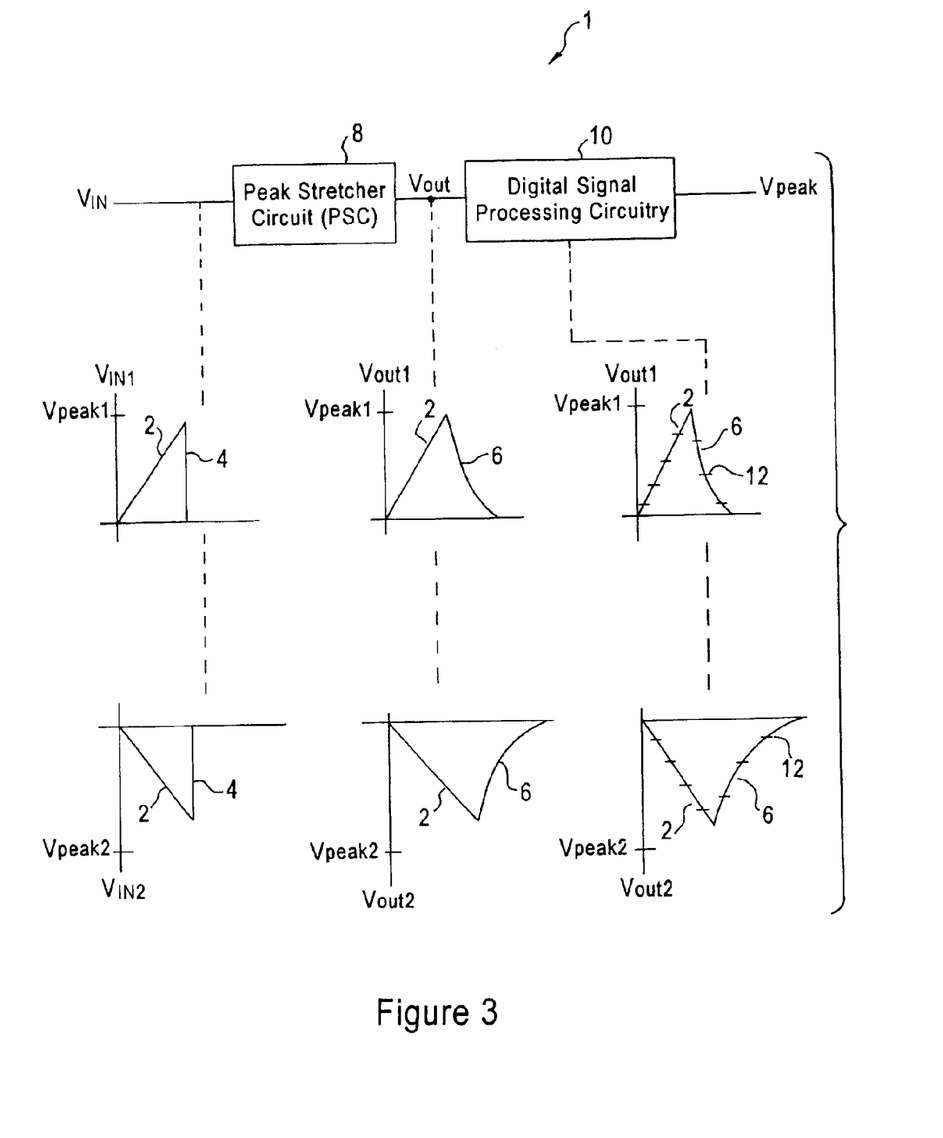
FIG. 3 illustrates a block diagram of a DSP assisted peak capture circuit.

FIG. 3 is a block diagram of a novel peak capture system 1, as disclosed herein. The system may be implemented in a diagnostic system or any other system requiring the capture and measurement of the peak values of applied waveforms. FIG. 3 shows further a waveform, $V_{IN}$, applied to the input of the peak capture circuit system 1. The applied waveform $V_{IN}$ takes many forms and is not limited to the illustrated waveform. The waveform may be linear or non-linear with peaks and valleys. As illustrated, $V_{IN}$ is shown by two alternative forms, a positive valued waveform $V_{IN1}$ and a negative valued waveform $V_{IN2}$, commonly referred to as waveform $V_{IN}$. Each waveform has a first portion having a first rate of change and a second portion having a relatively faster rate of change commensurate with a sawtooth-type waveform. FIG. 3 also depicts two output waveforms $V_{out1}$, $V_{out2}$ corresponding to the input of a positive valued waveform $V_{IN1}$, and a negative valued waveform $V_{IN2}$, discussed above. The output waveforms $V_{out1}$, $V_{out2}$ each have a positive peak value $V_{peak1}$ or a negative peak value $V_{peak2}$, commonly referred to as $V_{peak}$. Each output waveform $V_{out1}$, $V_{out2}$, commonly referred to as $V_{out}$, similarly has a first portion 2, as does $V_{IN}$, and a stretched portion 6.

One of the advantages of the concepts described herein is the ability to detect peak values $V_{peak}$ of either the positive waveform $V_{IN1}$ or the negative waveform $V_{IN2}$ especially of this nature. Moreover, the circuitry described herein overcomes the problems of conventional capture circuits by reliably detecting and capturing the peak voltage $V_{peak}$ of a waveform $V_{IN}$ with the use of a peak stretcher circuit (PSC) 8, which stretches the second portion 6 of the waveform $V_{IN}$ as a function of time allowing multiple sample readings to be taken by digital signal processing circuitry (DSP) 10.

Although the DSP 10 is illustrated in block diagram form, various implementations of DSP 10 are well known to those of skill in the art. These implementations may include integrated circuits to perform operations such as analog-to-digital conversions. Hardware or software may be used to perform calculations discussed herein.

PSC 8 is configured to monitor the first portion 2 of the input waveform, $V_{IN}$. At the peak, $V_{peak}$, the PSC 8 outputs a decaying signal creating a stretched portion 6. Sample readings may be taken by DSP 10 along this portion 6 of the waveform. Hash marks 12 represent the sample readings on both the first portion and stretched portions 2, 6. Using a DSP 10 to analyze the output waveform $V_{out}$, the PSC 8 may be reduced in complexity as compared to conventional hardware circuitry for detecting peak voltages, discussed herein. As a result, the PSC 8 advantageously has low noise and power characteristics, especially favoring signal processing of low input voltage waveforms as well of waveforms of the nature discussed above.

To calculate a peak voltage, DSP 10 samples both the first portion 2 and the stretched portion 6 of the output waveform $V_{out}$. Hash marks 12 indicate sample readings or points taken along the output waveform $V_{out}$. Advantageously, multiple samples may be taken along these portions 2, 6 of $V_{out}$ due to the stretching by PSC 8.

Figure 4:
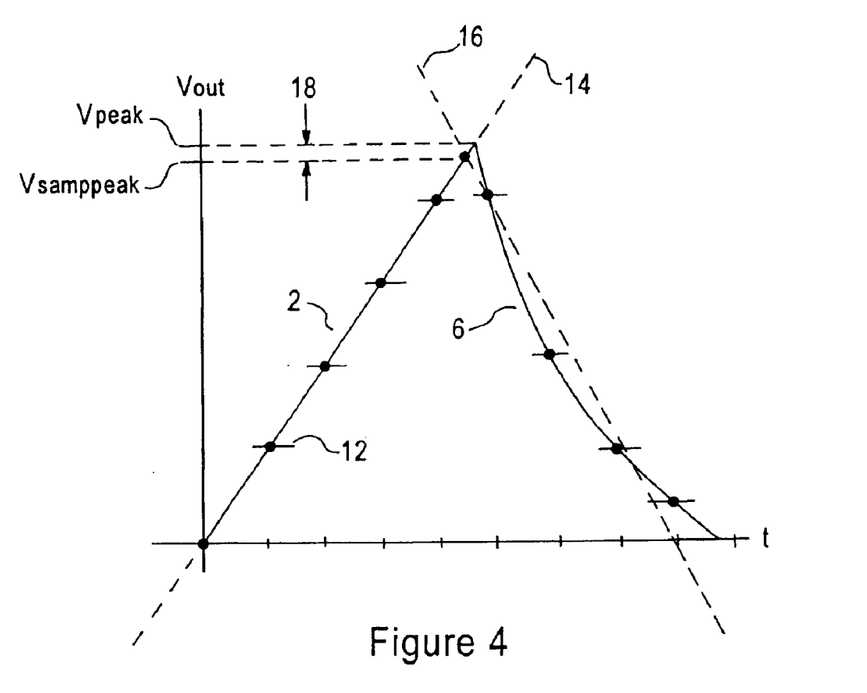
FIG. 4 illustrates the output signal of the DSP assisted peak capture circuit having superimposed thereon linear extrapolation representations.

The DSP 10 then linearly extrapolates using sample readings 12 to determine the peak value, $V_{samppeak}$. FIG. 4 illustrates an example of an output waveform $V_{out}$ having superimposed thereon the linear extrapolation 14 of the sampling reading taken along the first portion 2 and the linear extrapolation 16 of the sampling readings taken along the stretched portion 6. Techniques for linear extrapolation using sample readings of a waveform are well known to those of ordinary skill in the art and for brevity are not discussed herein. These techniques would be implemented by DSP 10.

As illustrated, there is slight deviation between $V_{samppeak}$ and $V_{peak}$. However, the deviation may be negligible in many diagnostic applications, and therefore ignored. In the event that this deviation concernedly lessens the accuracy of the peak capture system 1, a correction factor may be applied to $V_{samppeak}$ to determine $V_{peak}$. A designer may choose to compute the correction factor 18 based on known characteristics of circuitry components discussed below. In this regard, the correction factor may change depending on the input signal. The DSP 10 may be used to determine the correction factor 18 in this manner. In the alternative, a designer may assess typical implementations of the peak capture system 1, and conduct a test to determine a median correction factor 18 for a range of input waveforms $V_{IN}$ likely to be applied. In this regard, a static correction factor 18 could offset all $V_{samppeak}$ values to substantially $V_{peak}$, which would lessen computing power and time, as compared to the former.

Figure 5:
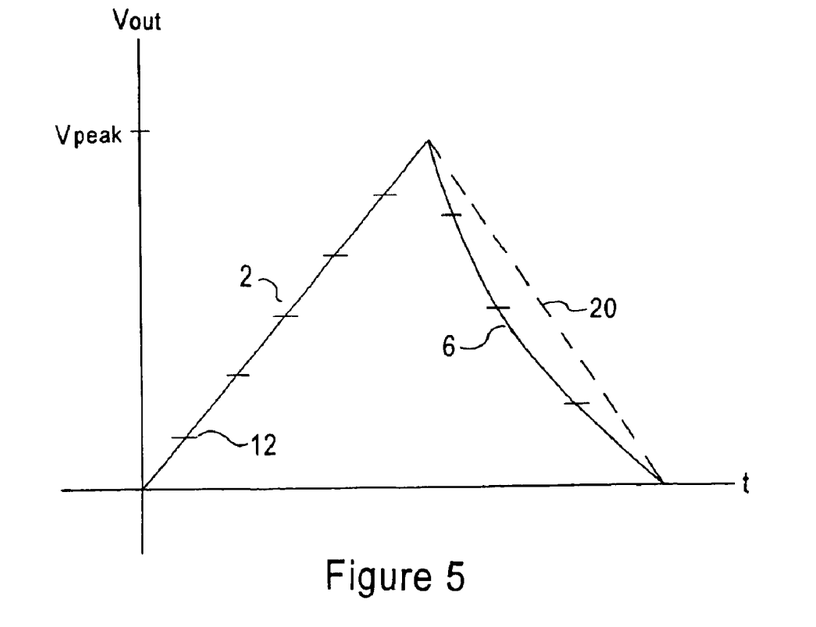
FIG. 5 illustrates the effects of distortion on the output of the peak capture circuit FIG. 6 schematically illustrates a peak stretcher circuit.

FIG. 5 illustrates a slight distortion introduced to the stretched portion of $V_{out}$, which is caused by resistor-capacitor (R-C) circuitry (shown in detail in FIGS. 6 & 7) of the PSC 8. The curvature of stretched (decayed) portion 6 relative to an ideal decayed portion 20 represents distortion. This distortion is often referred to as "droop," which is a common occurrence in signal processing and especially in decay circuitry. In many instances, droop may be ignored, as measurements are not significantly affected, as illustrated by FIG. 4. However, depending on the sensitivity requirement of the peak capture system 1, a designer may desire to compensate for the droop, as previously discussed.

The curvature of the droop is proportional to the decay rate of R-C circuitry. In other words, for a slower decay, the curvature of the droop becomes increasingly severe. The knee of the droop will be extend further in time (stretching increases) and the expanded steeply stretched portion takes 6 a longer time to reach a zero value. Thus, a higher rate allows an increasing number of sample readings. However, linear extrapolation 14, 16 based on sample readings 12 of the first portion 2 and stretched portion 6 for determining $V_{sampeak}$ becomes increasingly less accurate. A larger correction factor 18 is used in this instance. Design permitting, it is preferable to choose an stretching rate that permits multiple samples 12 to be taken, but small enough when the droop is negligible.

Figure 6:
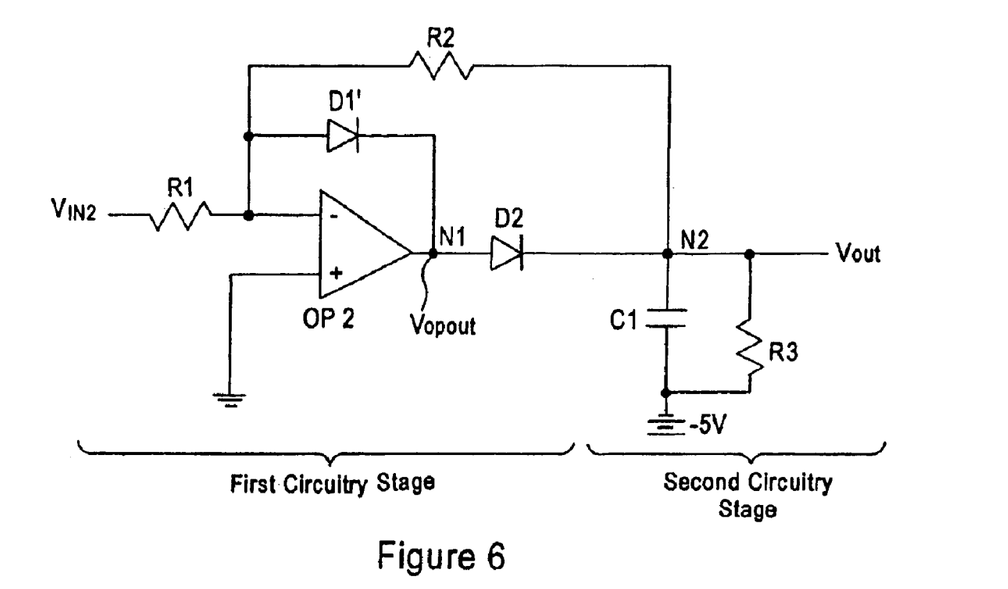
Figure 7:
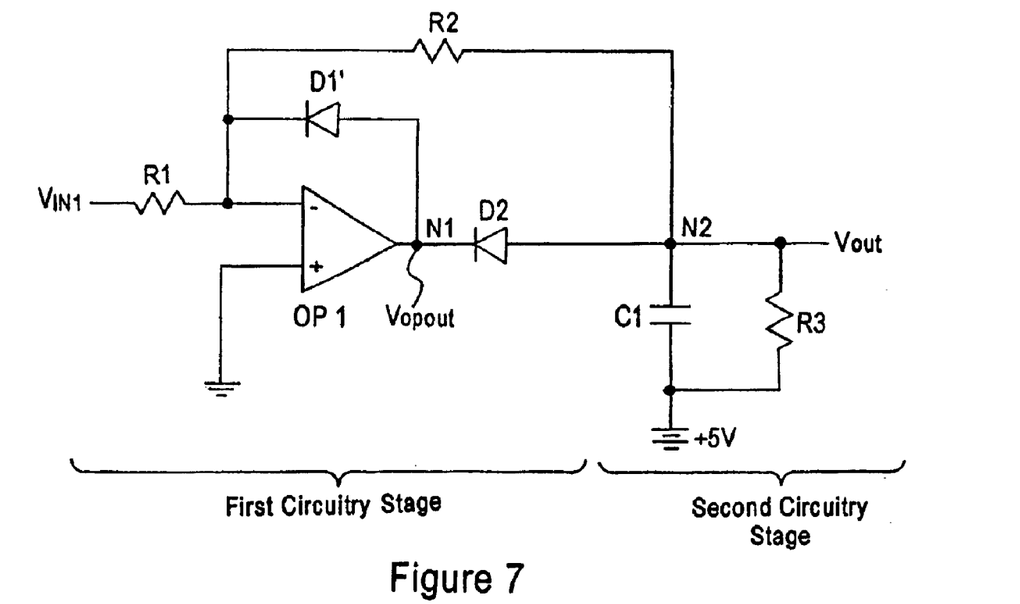
FIG. 7 schematically illustrates a peak stretcher circuit of an alternative configuration.
Figure 8A:
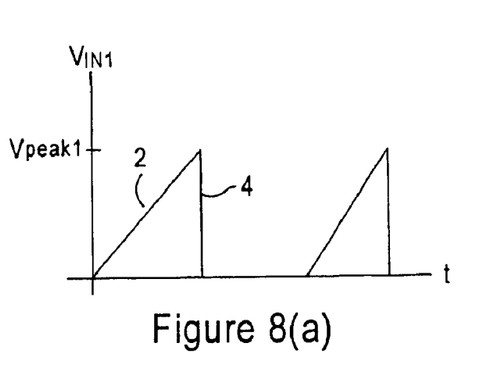
FIG. 8(a) illustrates a positive valued input waveform applied to the peak stretcher circuit of FIG. 6.
Figure 8B:
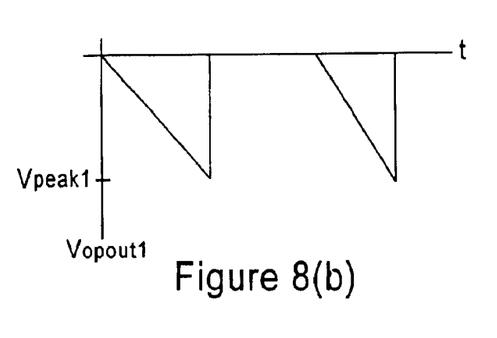
FIG. 8(b) illustrates the output of the operational amplifier of FIG. 6.
Figure 8C:
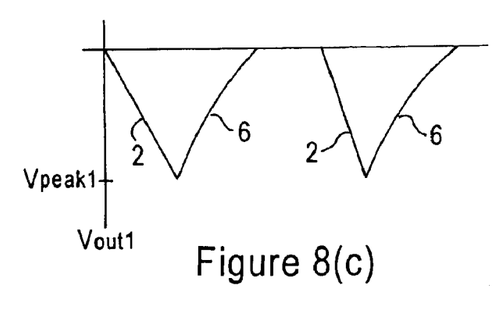
FIG. 8(c) illustrates the output of the peak capture circuit of FIG. 6.

FIG. 6 illustrates the peak stretcher circuit 8, for stretching a second portion 4 of a negative valued waveform $V_{IN2}$. FIG. 7 illustrates the peak stretcher circuit 8, for stretching a second portion 4 of a positive valued waveform $V_{IN1}$.

Comparing connections of components of FIGS. 6 and 7, in FIG. 6, diodes D1 and D2 are connected in a forward biased manner relative to the negative input of an Operation Amplifier (Op Amp) OP1. Conversely, diodes D1' and D2' are connected in a reversed biased manner. Moreover, in FIG. 6, a negative voltage of 5 volts is supplied to R-C circuit whereas, in FIG. 7, a positive voltage of 5 volts is applied to the R-C circuit. Otherwise, connections of remaining components are the same. The foregoing differences accommodate a positive value input waveform $V_{IN1}$ as in FIG. 7 and a negative valued waveform $V_{IN2}$ as in FIG. 6.

Referring again to FIGS. 6 and 7, the first circuitry stage is an inverter having a bypass. The first circuitry stage comprises a resistor R1 connected to the inverting (negative) input of the Op Amp OP1. Resistor, $R_2$ connects between the negative input and node N2. The non-inverting (positive) input of Op Amp OP1 connects to ground. In FIG. 6, forward biased diode D1 connects between the negative input and node N1, and forward biased diode D2 connects between nodes N1 and N2. In FIG. 7, reversed biased diode D1' connects between the negative input and node N1, and reversed biased diode D2' connects between nodes N1 and N2.

Assuming an ideal Op Amp OP1 operation, the output ratio with respect to $V_{IN}$ is as follows:

$$V_{OPout} = \frac{-R_2}{R_1} V_{IN}$$

It is preferable to choose resistor values R1 and R2 to be substantially equal, which corresponds to a gain of 1. If a gain is introduced, additional signal processing should be performed by DSP 10 when calculating peak voltage $V_{peak}$ in order to compensate for the gain. The additional signal processing is well known to those of ordinary skill in the art and is not explicitly discussed here. A designer may choose to vary the gain amount depending on the implementation.

The second circuitry stage (R-C circuitry) connects to the output of the first stage for decaying from the peak value at the second portion 4 of the waveform $V_{IN}$. A parallel connected resistor-capacitor (R-C) circuit, illustrated, connects between the output of the first circuitry stage and a –5 volt voltage source. The R-C circuit will impose a decay upon the input waveform $V_{IN}$ reaching $V_{peak}$ by discharging at a known decay rate during the falling edge of the waveform. The decay rate is given by the below equation. A designer may choose capacitor C1 and resistor values R3 for a desired decay rate. Further, the accuracy of the DSP 10 analysis is further enhanced by the known decay rate and predicable droop. The decay rate and droop is given by the following equations:

$$V_{out}(t) = (V_{OPout})\left(e^{\frac{-t}{(R3)(C1)}}\right) \text{ (assume } t = 0 \text{ at } V_{peak}\text{)}$$

Diodes D1, D2 or D1', D2' conduct during different parts of the input waveform $V_{IN}$ so as to output a inverted valued waveform at node N2. Once the waveform reaches peak value $V_{peak}$, and falls abruptly, diodes D1 and D2 enter into a non-conductive state, which allows the R-C circuit to discharge in accordance with a decay rate.

Referring to FIG. 7, diodes D1' and D2' are reversed biased, and the R-C circuit has a +5 power supply to accommodate detection of the positive valued waveform $V_{IN2}$. Contrary to this, in FIG. 6, diodes D1 and D1 are forward biased and R-C circuitry has a –5 power supply to accommodate a negative valued waveform $V_{IN1}$ Specifically, referring to FIGS. 8(*a*)–(*c*) in conjunction with FIG. 6, Op Amp OP1 outputs an inverted waveform $V_{OPout1}$ of input waveform $V_{IN1}$. Thus, during the time in which $V_{OPout1}$ is at a negative value, R-C circuit charges, and decays at the second portion 4 of the inverted waveform, thus creating an expanded steeply portion 6.

Figure 9A:
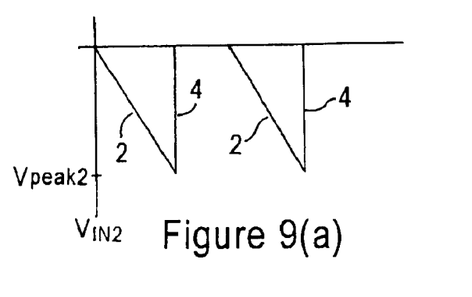
FIG. 9(a) illustrates a negative valued input waveform applied to the peak stretcher circuit of FIG. 7.
Figure 9B:
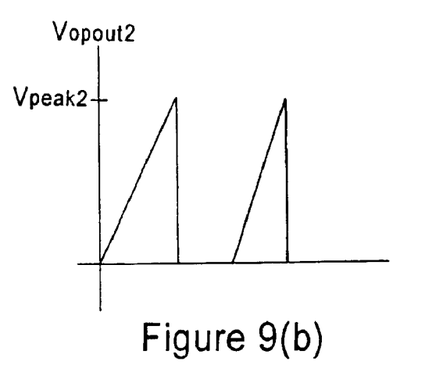
FIG. 9(b) illustrates the output of the operational amplifier of FIG. 7.
Figure 9C:
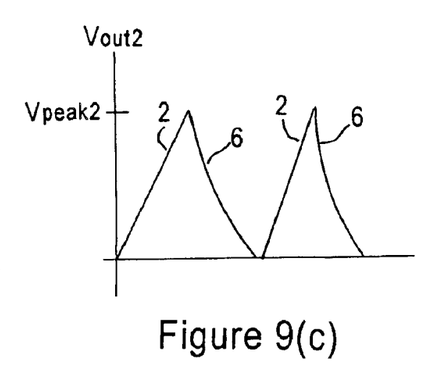
FIG. 9(c) illustrates the output of the peak capture circuit of FIG. 7.

Similarly, referring to FIGS. 9(*a*)–(*c*) in conjunction with FIG. 7, Op Amp OP2 outputs an inverted waveform $V_{OPout2}$ of input waveform $V_{IN2}$. Thus, during the time in which $V_{OPout2}$ is at a positive value, R-C circuit charges, and decays at the second portion 4 of the inverted waveform, thus creating a stretched portion 6.

Selection of the component values can be determined through calculations and experimental methods known in the art. As well, computer simulation packages may be used to determine optimal component values for a particular design criteria. To summarize the selection of component values:

1. Preferably, R1 and R2 are selected corresponding to a gain of 1, but this depends on design and implementation requirements.
2. R3 and C1 are selected to provide a rapid decay rate. In other words, the time for decaying from $V_{peak}$ the waveform should be small enough for increasingly accurate extrapolation but long enough to obtain multiple samples for a reliable measurement.
3. Diodes D1 and D2 prevent reverse current flow.
4. Power Supply voltage supplied to the R-C circuit is proportional to the decay rate. A higher absolute value of the power supply voltage increases the decay rate, as compared with a lower absolute value, which prolongs the decay rate. An absolute value of 5 volts has been found to provide a sufficiently stretched portion 6 while allowing samples to be taken. Other values may be used depending on implementation.

For example, in the second circuitry stage of the PSC 8, if capacitor C1 may have a value of 470 pico ($470 \times 10^{-12}$) farads, resistor R3 has a value of 1 mega ($1 \times 10^6$) ohms, and a peak input $V_{peak}$ of 0.4 milivolts is applied to the input of the PSC 8, the time to decay would be extremely quick. Based on points sampled during the decay, the DSP 10, applying the relationship discussed above, can extrapolate to determine $V_{peak}$. When compared with the slope of the second portion 2, the DSP 10 can accurately calculate the intersection point, $V_{peak}$, at 0.4 milivolt, or at a slight deviation thereof.

Figure 10:
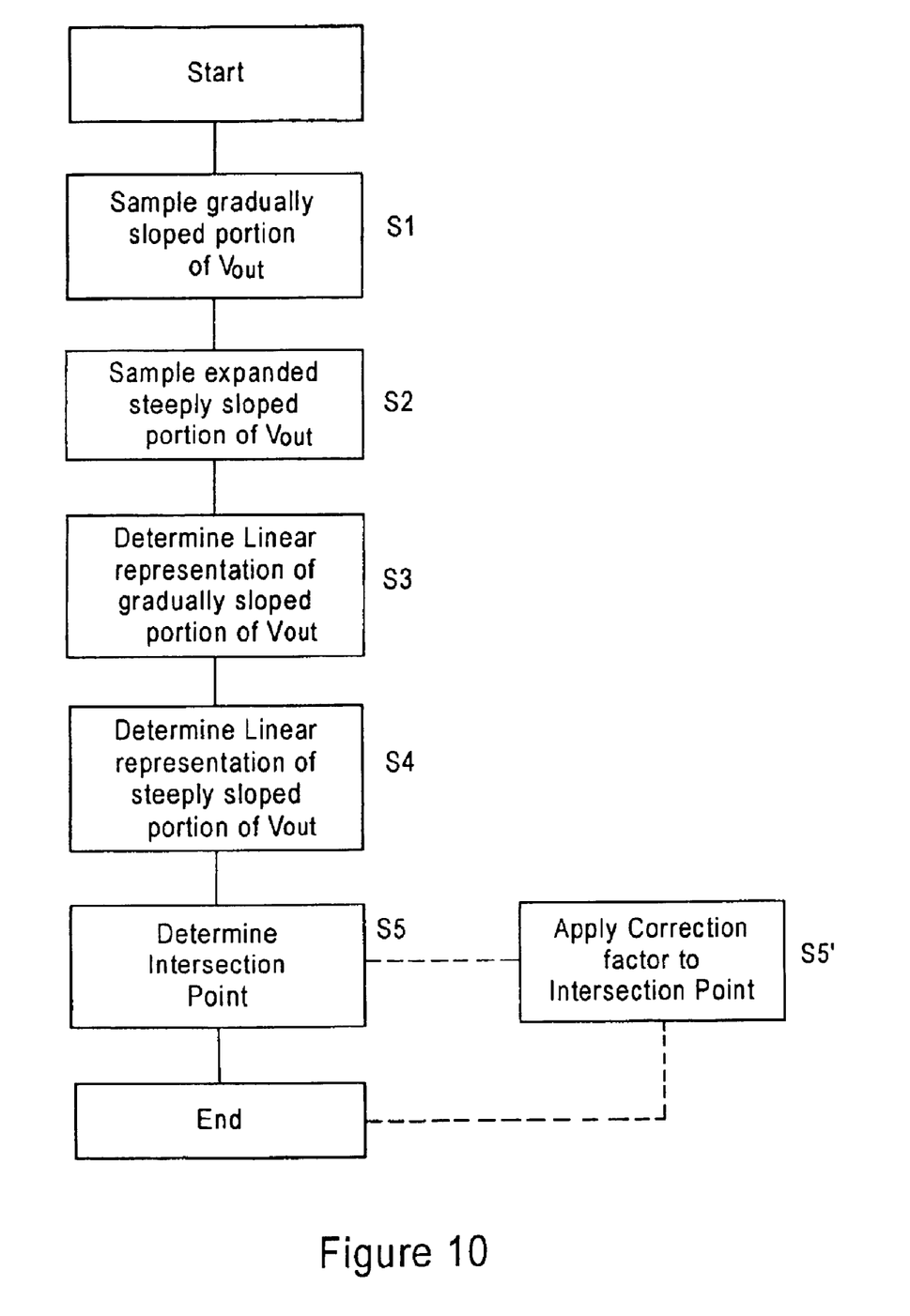
FIG. 10 is a block diagram of the DSP analysis performed on the signal at the output of the peak stretcher circuit.

FIG. 8 illustrates a flow chart of analysis by the DSP 10 calculation. The output $V_{out}$ of the PSC 8 is analyzed by the DSP 10. First, the output $V_{out}$ is sampled, steps S1 and S2. The sampling rate may be chosen depending on design requirements. A higher sampling rate promotes a greater accuracy but consumes more power and processing time. A designer may choose a sampling rate depending on the required accuracy, processing time, and power usage constraints. Step one and two, S1 and S2, may actually be the same step. However, for explanatory purposes, the sampling of the first portion 2 are distinguished from the stretched portion 6. Once sampled, the DSP 10 calculates the a linear representation 14 of the first portion 2 by analyzing sample values from step 1. In step 4, the DSP 10 calculates a linear representation 16 of the stretched sloped portion 6 by analyzing sampled values of step 2. When determining the peak voltage $V_{peak}$, step 5 (S5), the intersection of the linear representation 14, 16 is calculated using analysis. As a result, the intersection represents the peak Voltage, $V_{peak}$, of the input waveform, $V_{IN}$. At the option of the designer, as in step S5', a correction factor may offset the peak value at the intersection point to correct deviation between this point and the peak value of the input waveform.

The embodiments described herein may include or be utilized with any appropriate voltage source, such as a battery, an alternator and the like, providing any appropriate voltage, such as 12 volts, about 42 volts and the like.

The embodiments described herein may be used with any desired system or engine. Those systems or engines may comprise items utilizing fossil fuels, such as gasoline, natural gas, propane and the like, electricity, such as that generated by battery, magneto, solar cell and the like, wind and hybrids or combinations thereof. Those systems or engines may be incorporated into other systems, such as an automobile, a truck, a boat or ship, a motorcycle, a generator, an airplane and the like.

Although a novel DSP Assisted Peak Caption Circuit and Method have been described and illustrated in detail, it is clearly understood that the same is by way of illustration and example only and is not to be taken by way of limitation, the spirit and scope of the present invention being limited only by the terms of the appended claims.

What is claimed is:

1. Peak capture circuitry for measuring a peak value of a waveform characterized by a first portion having a first rate of change and a second portion having a relatively faster rate of change, comprising:
   peak stretching circuitry configured for stretching a portion of the waveform as a function of time; and
   digital signal processing circuitry configured for sampling an output waveform of the peak stretching circuitry for determining the peak value.

2. The peak capture circuitry according to claim 1, wherein the peak stretching circuitry is configured to stretch only the second portion of the waveform.

3. The peak capture circuitry according to claim 1, wherein the peak stretching circuitry is configured to stretch the second portion of the waveform at a predetermined rate.

4. The peak capture circuitry according to claim 1, wherein the peak stretching circuitry comprises:
   inverting circuitry for receiving the waveform and for outputting an inverted waveform; and
   R-C circuitry for receiving the inverted valued waveform, and for stretching a second portion of the inverted waveform.

5. The peak capture circuitry according to claim 4, wherein the inverting circuitry comprises:
   an operational amplifier having a positive input connected to ground and having an output connected to a first node;
   a first resistor connecting to a negative input of the operation amplifier, and
   a second resistor connected between the negative input and a second node.

6. The peak capture circuitry according to claim 5, wherein the inverting circuitry further comprises:
   a first diode connected between the negative input and the first node; and
   a second diode connected between the first node and the second node.

7. The peak capture circuitry according to claim 5, wherein the first and second diodes are connected to be forward biased relative to the negative input and the first node, respectively.

8. The peak capture circuitry according to claim 5, wherein the first and second diodes are connected to be reversed biased relative to the negative input and the first node, respectively.

9. The peak capture circuitry according to claim 4, wherein the R-C circuitry comprises:
   a resistor and a capacitor connected in parallel between a voltage source and an output of the inverting circuitry.

10. The peak capture circuitry according to claim 9, wherein the voltage source is negative.

11. The peak capture circuitry according to claim 9, wherein the voltage source is positive.

12. The peak capture circuitry according to claim 9, wherein the R-C circuitry is configured to have a decay of a predetermined rate.

13. The peak capture circuitry according to claim 9, wherein the R-C circuitry is configured to impose a decay during the second portion of the inverted valued waveform.

14. The peak capture circuitry according to claim 1, wherein the digital signal processing circuitry is configured to sample both the first portion and the stretched portion of the output waveform.

15. The peak capture circuitry according to claim 14, wherein the digital signal processing circuitry is configured to extrapolate using sample readings measured along the first portion and to extrapolate using sample reading measured along the stretched portion to determine an intersection point for determining a peak value.

16. The peak capture circuitry according to claim 15, wherein the digital signal processing circuitry is configured to linearly extrapolate using sample readings of the first portion and using sampling readings of the stretched portion.

17. The peak capture circuitry according to claim 15 wherein the digital signal processing circuitry is configured to adjust the intersection point relative to a correction factor for determining the peak value of the waveform.

18. A peak capture device for measuring a peak value of a waveform characterized by a first portion having a first rate of change and a second portion having a relatively faster rate of change, comprising waveform expansion means for stretching a portion of the waveform as a function of time; and digital signal processing means for sampling an output of the waveform stretching means for determining a peak value.

19. The peak capture device according to claim 18, wherein the waveform stretching means stretches only the second portion of the waveform.

20. The peak capture device according to claim 18, wherein the waveform stretching means stretches the second portion of the waveform at a predetermined rate.

21. The peak capture device according to claim 18, wherein the waveform stretching means comprises:

first circuitry means for receiving the waveform and output an inverted waveform;

second circuitry means for receiving the inverted waveform and stretch the second portion as a function of time.

22. The peak capture device according to claim 18, wherein the signal processing means comprises:

sampling means for sampling the first portion of the inverted waveform and for sampling the stretched portion; and peak voltage calculation means for determining the peak voltage based on sample readings of the first portion and of the stretched portion.

23. The peak capture device according to claim 22, wherein the peak voltage calculation means determines a first linear representation of the first portion based on corresponding sampling readings and determines a second linear representation of the stretched portion based on corresponding sampling readings.

24. The peak capture device according to claim 23, wherein the peak voltage calculation means determines the peak value based on an intersection between the first and second linear representations.

25. The peak capture device according to claim 18, wherein the digital signal processing means offsets the peak value by a correction factor for determining the peak value of the waveform.

26. A method for measuring a peak value of a waveform characterized by a first portion having a first rate of change and a second portion having a relatively faster rate of change, the method comprising the steps of:

stretching the second portion of the waveform as a function of time;

sampling the first portion;

sampling the stretched portion; and extrapolating using sampling readings of the first portion and the stretched portion to determine a peak value.

27. The method of claim 26, wherein the stretching step comprises the steps of:

outputting the first portion of the waveform; and outputting the second portion at a predetermined decay rate.

28. The method of claim 26, wherein the steps of extrapolating comprises the steps of:

determining a first linear representation of the first portion using corresponding sampling readings;

determining a second linear representation of the stretched portion using corresponding sampling readings; and determining the peak value as a function of the intersection of the first linear representation and the second linear representation.

29. The method of claim 26, further comprising:

applying a correction factor to the peak value determined in the extrapolating step to determine the peak value of the waveform.

30. The method of claim 26, wherein the stretching step stretches the second portion at a predetermined decay rate.

* * * * *